(12) United States Patent
Sahu et al.

(10) Patent No.: US 8,041,975 B2
(45) Date of Patent: *Oct. 18, 2011

(54) PROGRAMMABLE I/O CELL CAPABLE OF HOLDING ITS STATE IN POWER-DOWN MODE

(75) Inventors: Biranchinath Sahu, Austin, TX (US); Douglas F. Pastorello, Hudson, NH (US); Golam R. Chowdhury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 721 days.

This patent is subject to a terminal disclaimer.

(21) Appl. No.: 12/120,015

(22) Filed: May 13, 2008

(65) Prior Publication Data
US 2008/0246526 A1    Oct. 9, 2008

Related U.S. Application Data

(63) Continuation of application No. 11/241,277, filed on Sep. 30, 2005, now Pat. No. 7,373,533.

(51) Int. Cl.
*G06F 1/26*    (2006.01)
(52) U.S. Cl. ......... 713/324; 327/143; 327/198; 713/320

(58) Field of Classification Search ............ 327/143, 327/198; 713/320, 324
See application file for complete search history.

(56) References Cited

U.S. PATENT DOCUMENTS

| | | | |
|---|---|---|---|
| 6,753,698 B2 | 6/2004 | Carpenter et al. | |
| 6,882,200 B2 * | 4/2005 | Ahsanullah et al. | .......... 327/199 |
| 7,161,386 B2 | 1/2007 | Takiba et al. | |
| 2006/0290404 A1 | 12/2006 | Law | |

* cited by examiner

*Primary Examiner* — Albert Wang
(74) *Attorney, Agent, or Firm* — Polansky & Associates, P.L.L.C.

(57) ABSTRACT

The present invention comprises a microcontroller unit including a processor for generating a power down signal. Control logic generates a hold signal responsive to the power down signal. A voltage regulator provides a regulated voltage responsive to an input voltage and powers down responsive to the power down signal. At least one digital device powered by the regulated voltage enters a powered down mode responsive to the voltage regulator entering the powered down state. The at least one digital device provides at least one digital output signal that is provided to an input/output cell. The input/output cell also is connected to receive a hold signal. The input/output cell maintains a last state of the digital output signal responsive to the hold signal when the at least one digital device enters the powered down state.

20 Claims, 10 Drawing Sheets

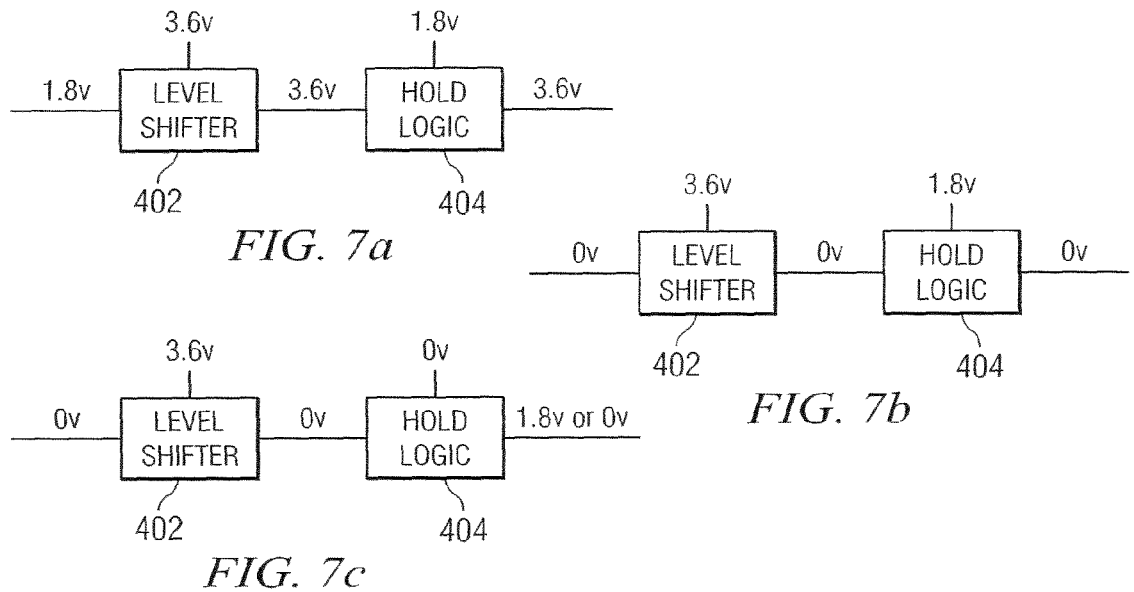
FIG. 7a
FIG. 7b
FIG. 7c
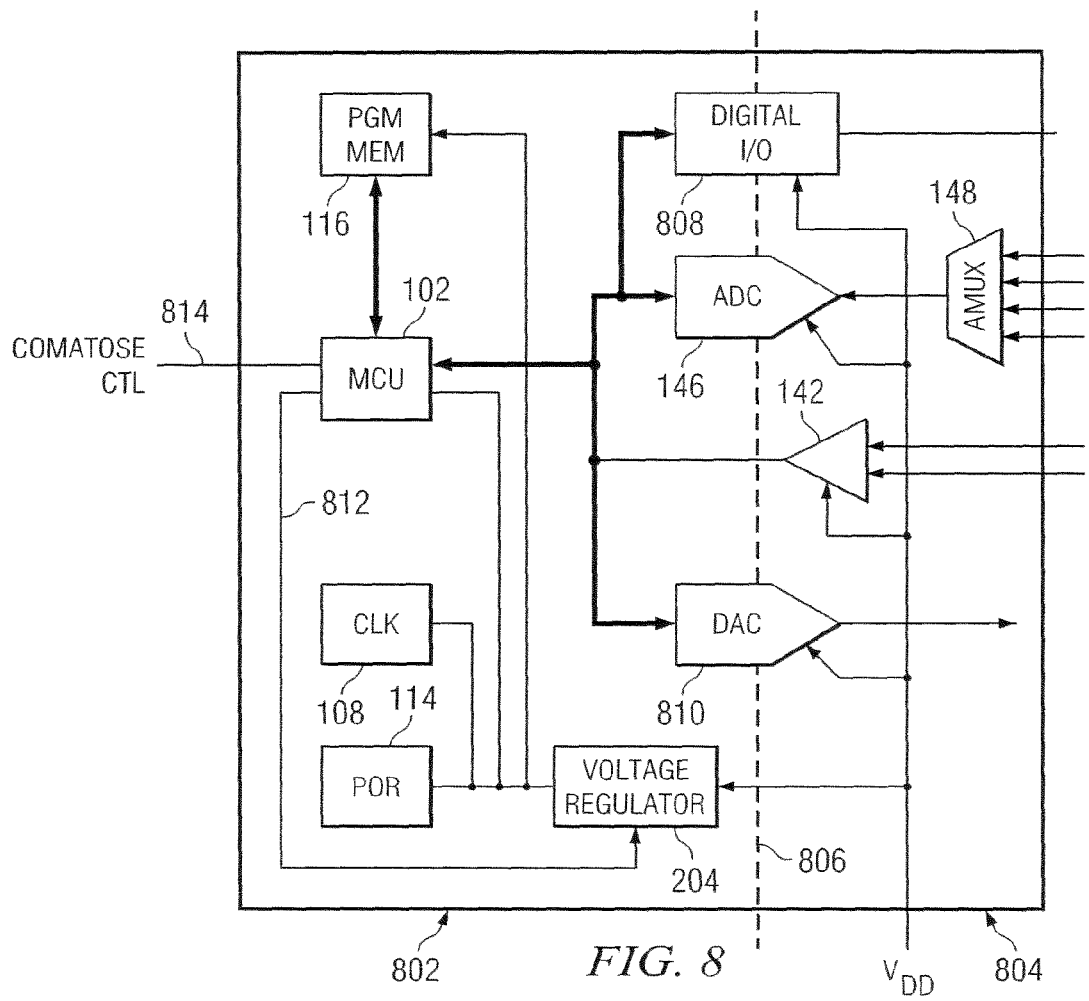
FIG. 8

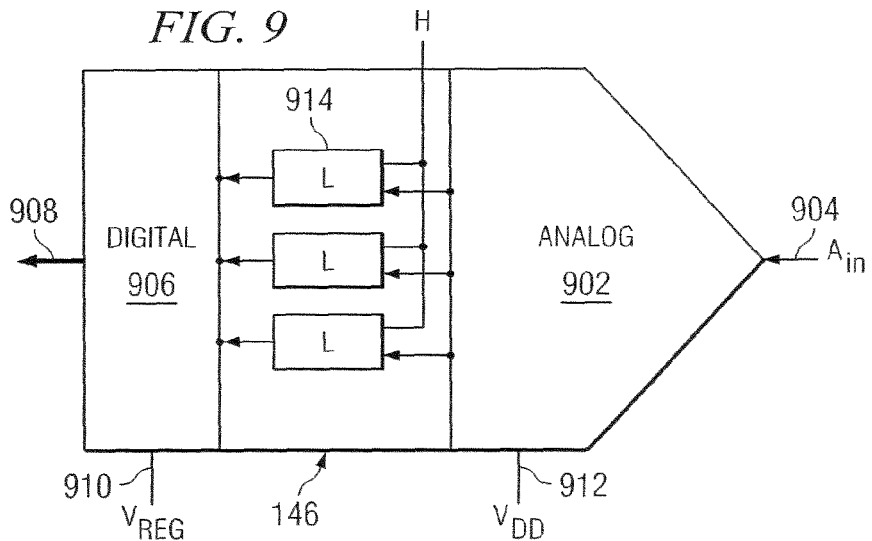
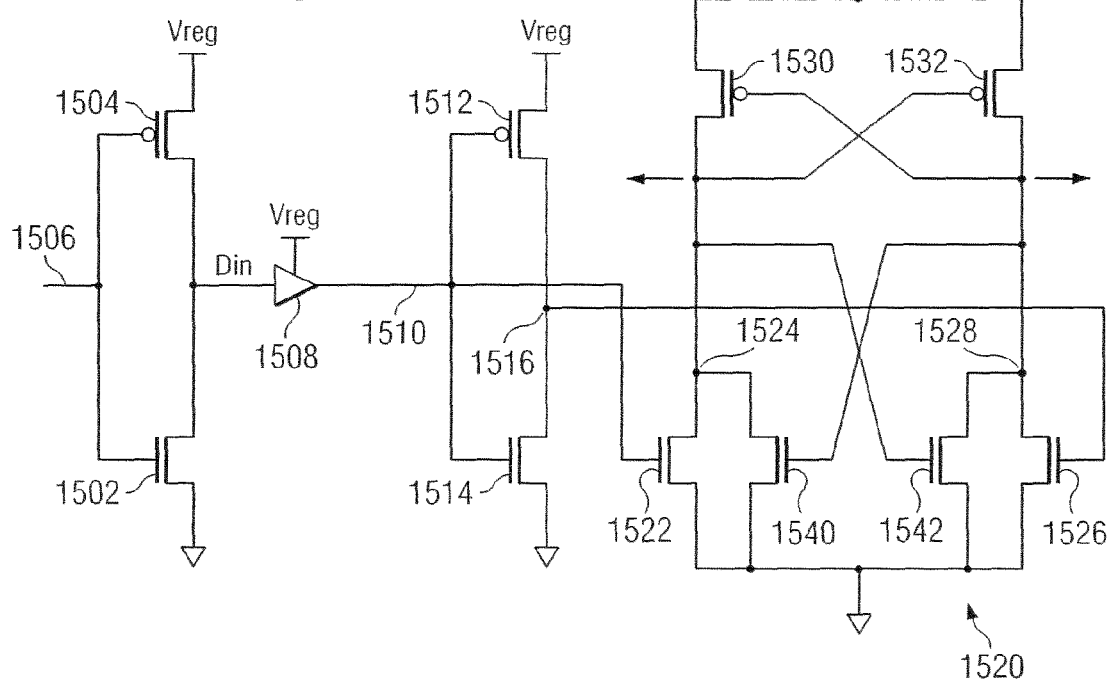

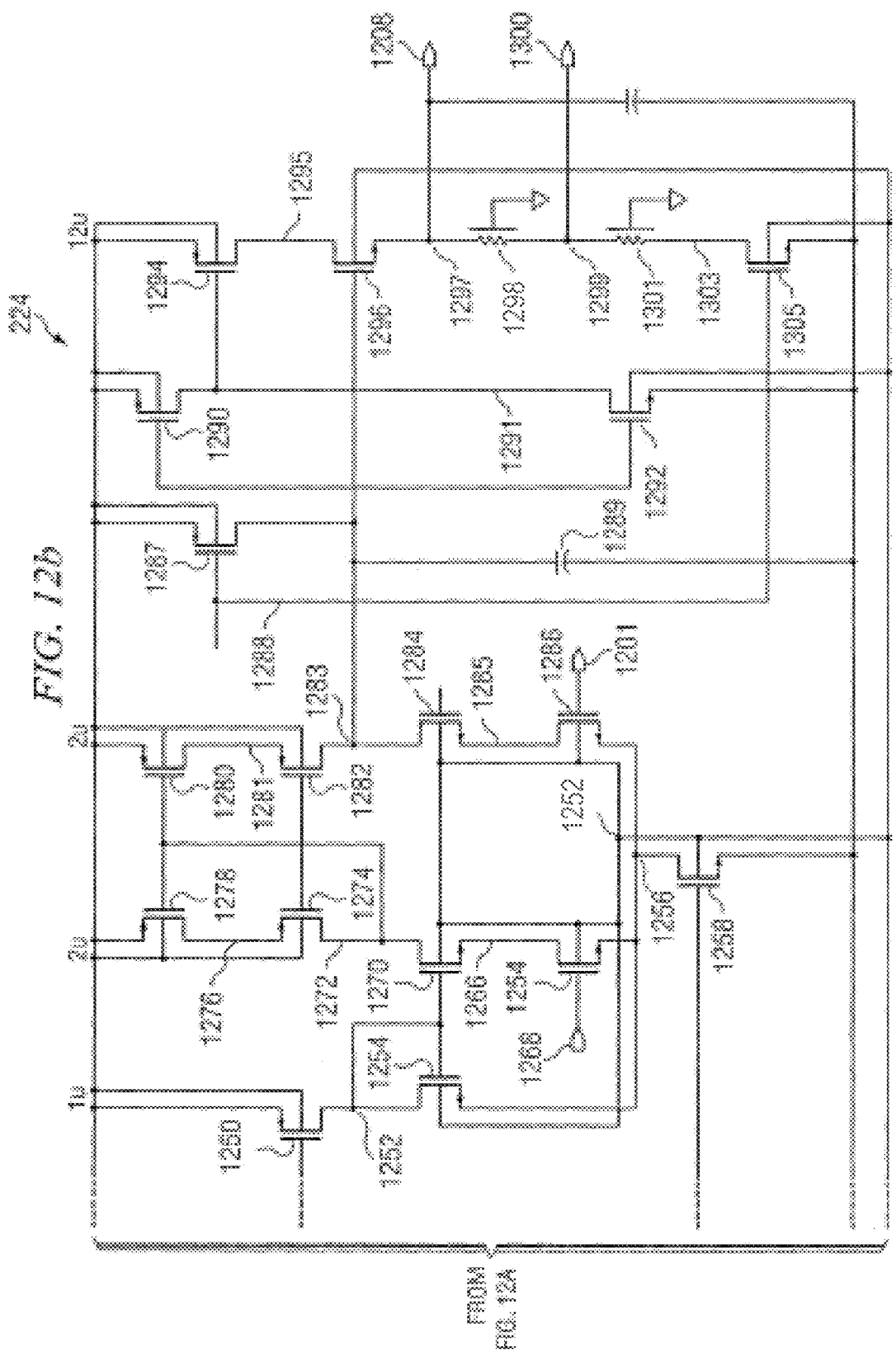

PROGRAMMABLE I/O CELL CAPABLE OF HOLDING ITS STATE IN POWER-DOWN MODE

CROSS REFERENCE TO RELATED APPLICATIONS

This application is a continuation of U.S. Pat. No. 7,373,533, issued May 13, 2008 and entitled PROGRAMMABLE I/O CELL CAPABLE OF HOLDING ITS STATE IN POWER-DOWN MODE, which is incorporated herein by reference.

TECHNICAL FIELD

The present invention relates to input/output cells of digital circuits, and more particularly, to a system and method for maintaining a state of a digital output during a power down mode.

BACKGROUND

MCU chips include both digital and analog circuitry thereon for performing the various processes and functionalities available from the chip. In order to save power on MCU chips it is often necessary to enable a standby mode of operation wherein certain functionalities of the MCU chip are powered down or inoperative in order to conserve battery power. This enables the prolonging of battery life in state of the art, battery-powered, portable applications. An MCU chip having an on-chip power supply for digital circuits needs to be able to operate with low static (quiescent) power consumption while enabling the use of widely variable external supply voltages such as a battery for the chip. In order to save power when the MCU chip is not in use, a standby low power mode may be used to minimize power losses of the digital circuit when clocked by the system clock and to eliminate the quiescent current of the regulator and bandgap reference circuits. In some situations, the clock circuitry is halted, thus reducing power due to switching of digital circuitry. In other power saving applications, the complete chip is powered down and configuration information saved in non-volatile RAM (NVRAM). However, in this latter situation the MCU chip may be interfacing with other outside chips in an application system wherein these interfaces enable and disable the outside chips via control signals from the I/O ports of the MCU chip. During a complete power-down mode, the control signals of the I/O port would float. There must be some manner for preserving the states of the input/output ports during a power-down condition of the MCU chip, such that there is no contention of states of the pins of the MCU and other peripheral devices connected to it.

SUMMARY

The present invention disclosed and claimed herein, in one aspect thereof, comprises a microcontroller unit. The microcontroller unit includes a processor for generating a power down signal. Control logic generates a hold signal responsive to the power down signal. A voltage regulator provides a regulated voltage responsive to an input voltage and powers down responsive to the generated powered down signal. At least one digital device powered by the regulated voltage enters a powered down state responsive to the voltage regulator entering the powered down state. The at least one digital device additionally provides a digital input signal to an input/output cell. The input/output cell is connected to receive both the digital signal and the hold signal. The input/output cell maintains a last state of the digital output signal responsive to the hold signal when the at least one digital device is in the powered down state.

BRIEF DESCRIPTION OF THE DRAWINGS

For a more complete understanding of the present invention and the advantages thereof, reference is now made to the following description taken in conjunction with the accompanying Drawings in which:

FIGS. 7a-7c illustrate the operation of the input/output cell;

FIG. 8 illustrates the digital and analog portions of a chip;

FIG. 9 illustrates a circuit component with digital and analog portions;

FIGS. 12a and 12b are schematic diagrams of the voltage regulator;

FIG. 15 is an alternate embodiment of the hold latch.

DETAILED DESCRIPTION OF THE INVENTION

Figure 1:
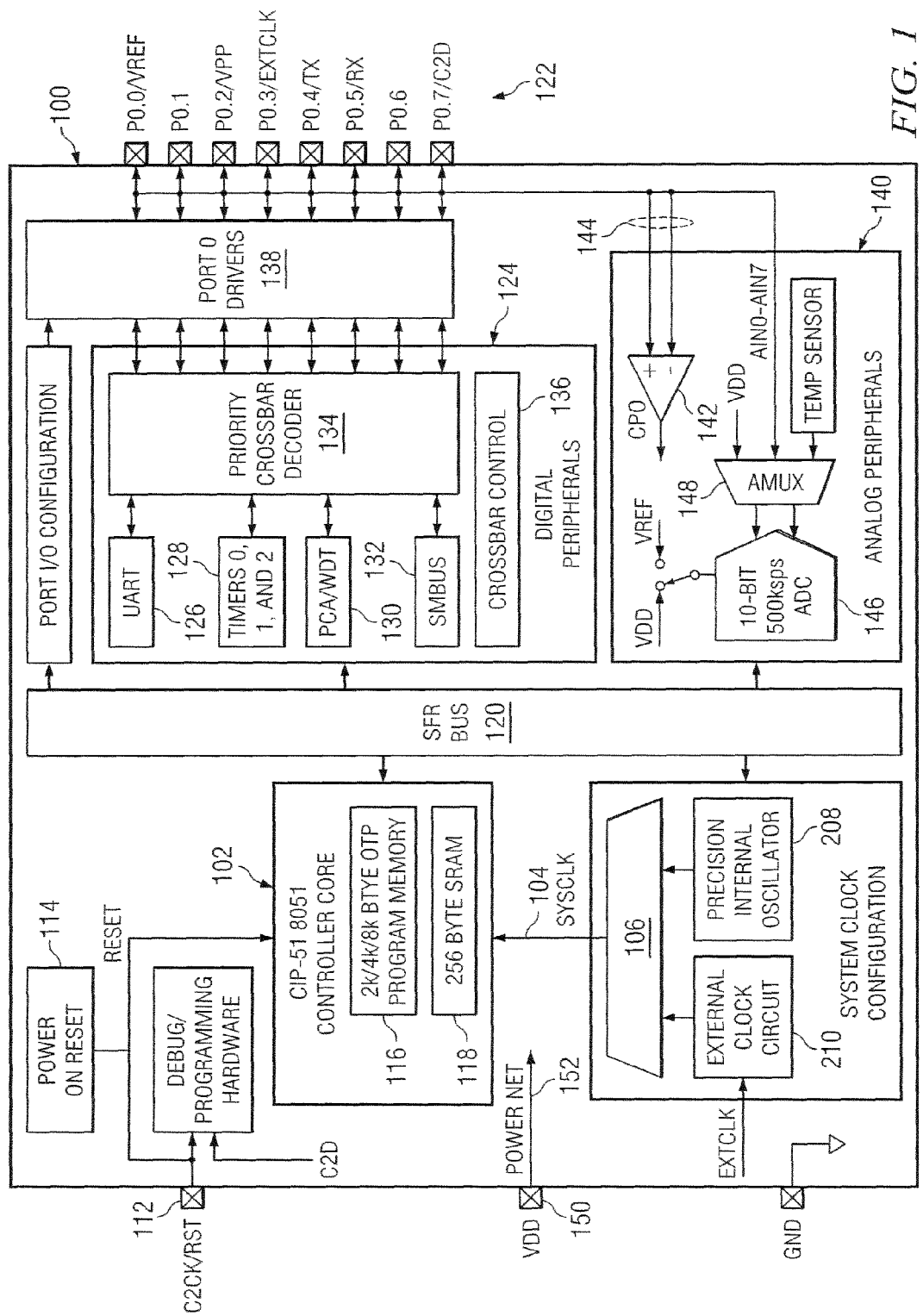
FIG. 1 is a block diagram of the MCU chip showing various functionalities thereof.

Referring now to the drawings, and more particularly to FIG. 1, there is illustrated a block diagram of a microcontroller unit (MCU) 100. The MCU 100 is generally of the type similar to the family of part Nos. C8051F300 manufactured by Silicon Laboratories, which are generally referred to as "8051 Mixed-Signal Controllers." The MCU 100 includes a processing core 102 which is typically comprised of a conventional 8-bit microprocessor of the type "8051." The processing core 102 receives a clock signal on line 104 from a multiplexer 106. The multiplexer 106 is operable to select among multiple clocks. There is provided a 24.5 MHz trimmable internal precision oscillator 108 or an external crystal control oscillator 110. The precision internal oscillator 108 is described in U.S. Patent Application Publication No. 2004/0054835, entitled "PRECISION OSCILLATOR FOR AN ASYNCHRONOUS TRANSMISSION SYSTEM," filed Sep. 16, 2002, which is incorporated herein by reference in its entirety. The processing core 102 is also operable to receive an external reset on test terminal 112 or is operable to receive the reset signal from a power on reset block 114, all of which provide a reset to processing core 102. The power or reset block 114 may also be used to bring the MCU 100 out of a comatose mode. The processing core 102 has associated therewith a plurality of memory resources, those being either a 2K/4K/8K byte One Time Programmable (OTP) program memory 116 and a 256K byte SRAM memory 118. The OTP program memory 116 is basically a flash memory device that is factory programmable. The processing core 102 interfaces with various digital and analog peripherals via an SFR bus 120. The SFR bus 120 is a special function register bus that allows the processing core 102 to interface with various output pins 122 that can interface external to the chip to receive digital values, output digital values, receive analog values or output analog values. Various digital I/O peripherals 124 are provided, these being a UART 126, timers 128, PCA/WDT 130 and SMbus interface circuit 132. All of this circuitry 126-132 is interfaceable to the output pins 122 through a crossbar decoder 134 which is operable to configurably interface these devices with select ones of the outputs responsive to control signals from the crossbar control 136. Port drivers 138 are used for driving the signals received from the priority crossbar decoder 134 to the output pins 122. The crossbar decoder is described in U.S. Pat. No. 6,839,795, which is incorporated herein by reference.

The digital inputs/outputs to/from the digital peripherals 124 are also interfaced to analog peripherals 140. The analog peripherals 140 include an analog comparator 142 for comparing two signals received on input lines 144. The analog-to-digital converter 146 receives analog input signals from an analog multiplexer 148 interfaced to a plurality of the input pins on the MCU 100. The analog multiplexer 148 allows the multiple outputs to be sensed through the pins 122 such that the ADC 146 can be interfaced to various sensors. System power VDD is applied through pad 150. Power may be applied to the pad 150 via, for example, a battery. The power net 152 applies power to both the analog peripherals 140 and the digital peripherals 124 to power the device, as will be more fully described below.

Figure 2:
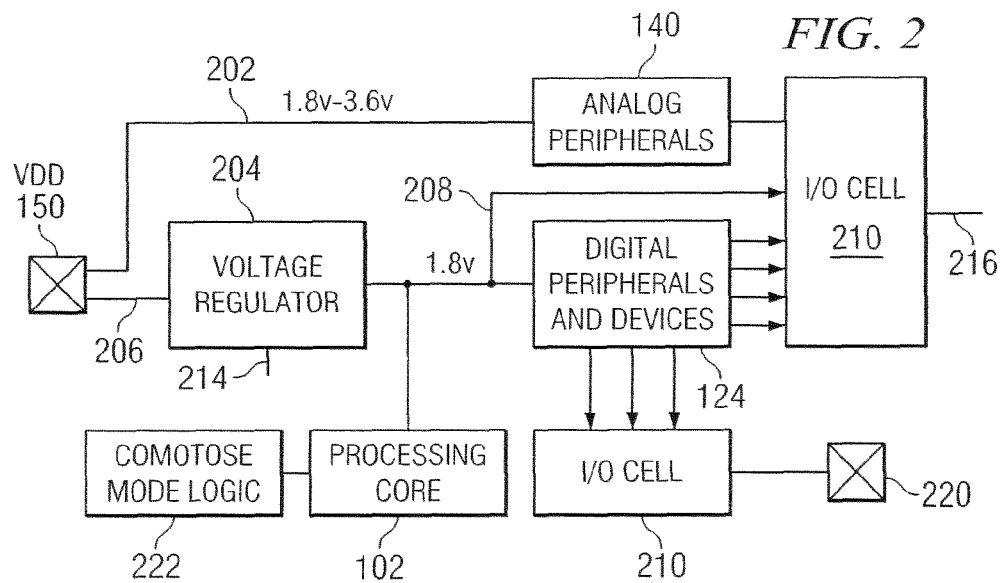
FIG. 2 is a block diagram illustrating the power net and the associated input/output cells with hold capabilities.

Referring now to FIG. 2, there is more fully illustrated a portion of the power net 152 associated with the MCU 100. The VDD terminal 150 provides a 1.8V to 3.6V signal to the analog peripherals 140 via line 202 using, for example, a battery. The 1.8V to 3.6V signal is also provided to a voltage regulator 204 via line 206. The voltage regulator 204 provides a regulated 1.8V signal via lines 208 to the digital peripheral devices 124, the controller core 102 and an I/O cell 210 in a powered mode of operation. The voltage level of the digital circuitry such as the controller core, digital peripherals, etc., is defined by the manufacturing process. As resolutions increase and line widths decrease, operating voltages decrease. However, the external circuitry may operate on a different voltage level. Usually, the I/O circuitry will incorporate level shifters to accommodate the differing levels. The I/O cell 210 to provide this interface is located within the port drivers 138 or between the output/input of the port drivers 138 and the analog peripherals 140. In addition to placing an input/output cell 210 between the peripheral devices 124 and the analog peripherals 140, an input/output cell 210 may be placed between the digital peripheral devices 124 and an external output pin 220.

The voltage regulator 204 may be placed into a comatose mode responsive to the input received at input 214 from the processor 102. The comatose mode of the voltage regulator 204 is controlled by the comatose mode logic 222. The comatose mode logic 222 is responsive to inputs from processing core 102. When in the comatose mode, the voltage regulator 204 will output a regulated zero voltage no matter what voltage input is received from the VDD pad 150 on line 206. By providing a 0 V regulated voltage output from the voltage regulator 204, the processing core 102, all digital peripherals and devices 124 receiving the regulated 0 V signal will provide a corresponding 0 V output signal (digital "0") on their digital output lines and maintain this digital output signal at this level during the comatose mode state. By providing a 0 V regulated output voltage to the processing core 102 and digital peripherals 124, the digital outputs from the digital peripherals 124 remain in a steady 0 V state rather than having the output digital signals float to unknown states as would occur if the voltage regulator and digital peripherals where turned off.

Figures 3A, 3B:
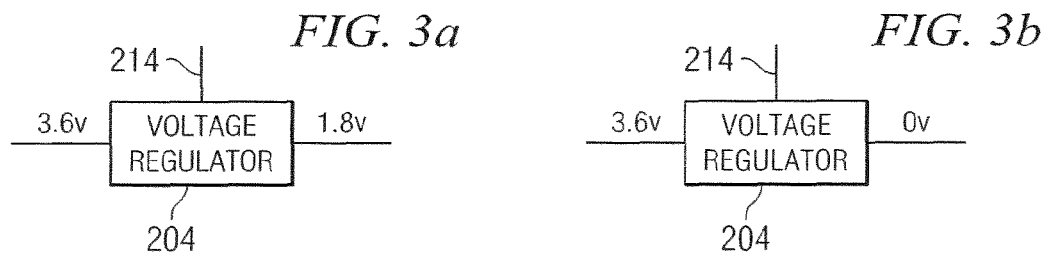
FIGS. 3a and 3b illustrate the operation of the voltage regulator in various modes.

FIG. 3a illustrates the operation of the voltage regulator 204 responsive to a comatose mode enable control signal received on input 214 from the processing core 102. When the input 214 of the voltage regulator 204 receives a powered mode signal, and the 0-3.6 V voltage supply is input from the associated power supply or battery source, the voltage regulator 204 provides a regulated 1.8 V voltage signal.

Referring now to FIG. 3b, when the input 214 to the voltage regulator 204 receives a comatose mode enable signal and the unregulated input voltage is still 1.8-3.6 V, the regulated output voltage remains 0 V to the digital circuits no matter what the input voltage since the regulator 204 is disabled. This causes the digital peripherals 124 to limit power use while providing the digital circuit outputs a known digital low state responsive to the 0 V input. As will be described hereinbelow, a reset signal will reset the output of the regulator 204 to its regulated voltage level and a Power on Reset (POR) operation will follow.

Figure 4:
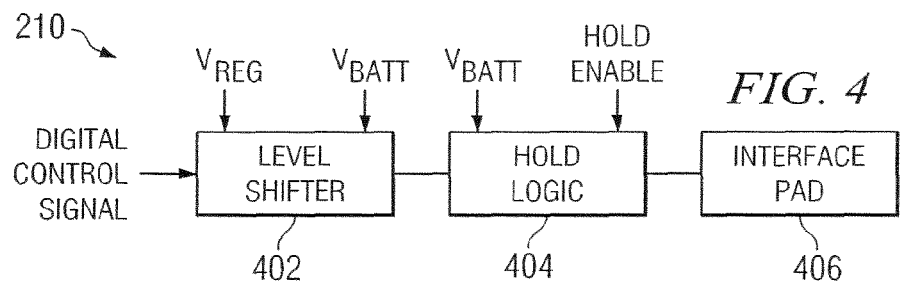
FIG. 4 is a block diagram illustrating the input/output cell.

Referring now to FIG. 4, there is more fully illustrated the input/output cell 210. Digital output signals are input into a level shifter 402 within the input/output cell 210. Additional signals into the level shifter 402 include the regulated voltage from the voltage regulator 204 and the unregulated system voltage VDD provided from pad 150. The I/O cell 210 additionally includes a hold enable input 216 that enables the output of the I/O cell 210 received from the digital peripherals 124 to be maintained at a constant state during the comatose mode. The level shifter circuit 402 shifts the voltage level of the signal provided by the digital peripherals 124 in the regulated power domain to a level appropriate for the analog peripherals 140 in the unregulated power domain or digital I/O pins. The level shifted signal is input to hold logic 404. The hold logic 404 is also connected to receive system power VDD from pad 150 and is also configured to receive a hold enable signal provided by the comatose mode logic 220. The hold enable signal enables a last state of a digital signal provided to the input of the hold logic 404 to be latched onto the output of the hold logic 404 when the digital peripherals 124 are powered down responsive to receipt of an 0 V signal from the voltage regulator 204. When the voltage regulator 204 enters the comatose state, it provides a 0 V regulated voltage to the digital peripherals 124. The outputs of the digital peripherals go to 0 V and the output of the level shifter goes to 0 V responsive to the regulated 0V signal. This would create problems if the signals output by the digital peripheral 124 were necessary to enable or disable an external device connected to the MCU 100 or an internal analog peripheral 140. Another problem may arise if the configuration of a digital output were reconfigured to switch between an output and an input due to an internal digital configuration signal being in an unknown state. By latching the last state of the digital control signal to the output of the hold logic 404, the last state of the digital control signal is maintained on the output. The output of the hold logic 404 is provided to an interface pad 406. In addition to an interface pad 406, the signal output from the hold logic 404 could also be input directly to an analog peripheral 140 as a digital value that is level shifted.

Figure 5:
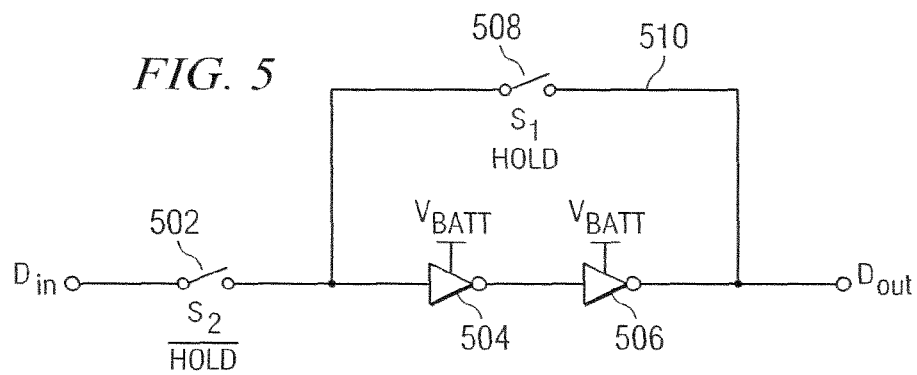
FIG. 5 is a logic diagram of the hold logic of the input/output cell.

Referring now to FIG. 5, there is illustrated a logic diagram of the hold logic 404. $D_{IN}$ represents the level shifted digital output signal provided from the level shifter 402. $D_{OUT}$ represents the digital output signal provided from the output of the hold logic 404. $V_{DD}$ comprises the system voltage provided to the hold logic 404 and is also used to power the inverters 504 and 506. When the hold signal is low (digital "0"), switch 502 is closed and switch 508 is opened. This causes the digital control signal applied to the input $D_{IN}$ to pass through the hold logic 404 and be provided as the output signal $D_{OUT}$. When the hold signal goes high (digital "1") as the voltage regulator 240 enters the comatose state, switch 502 is opened and switch 508 is closed. The last state of $D_{OUT}$ is fed back through a feedback loop 510 to the input of the inverters 504, 506. This causes the input/output cell 210 to remain in its last received state during the comatose mode. In this way, whatever signal is being applied to $D_{IN}$ when the hold enable signal goes high will be maintained at the output of $D_{OUT}$ during the comatose mode. This output can drive an output pad where the I/O circuit is configured as a digital output or it can drive another internal peripheral digital input to a peripheral circuit in the unregulated power domain during the comatose mode.

Figure 6:
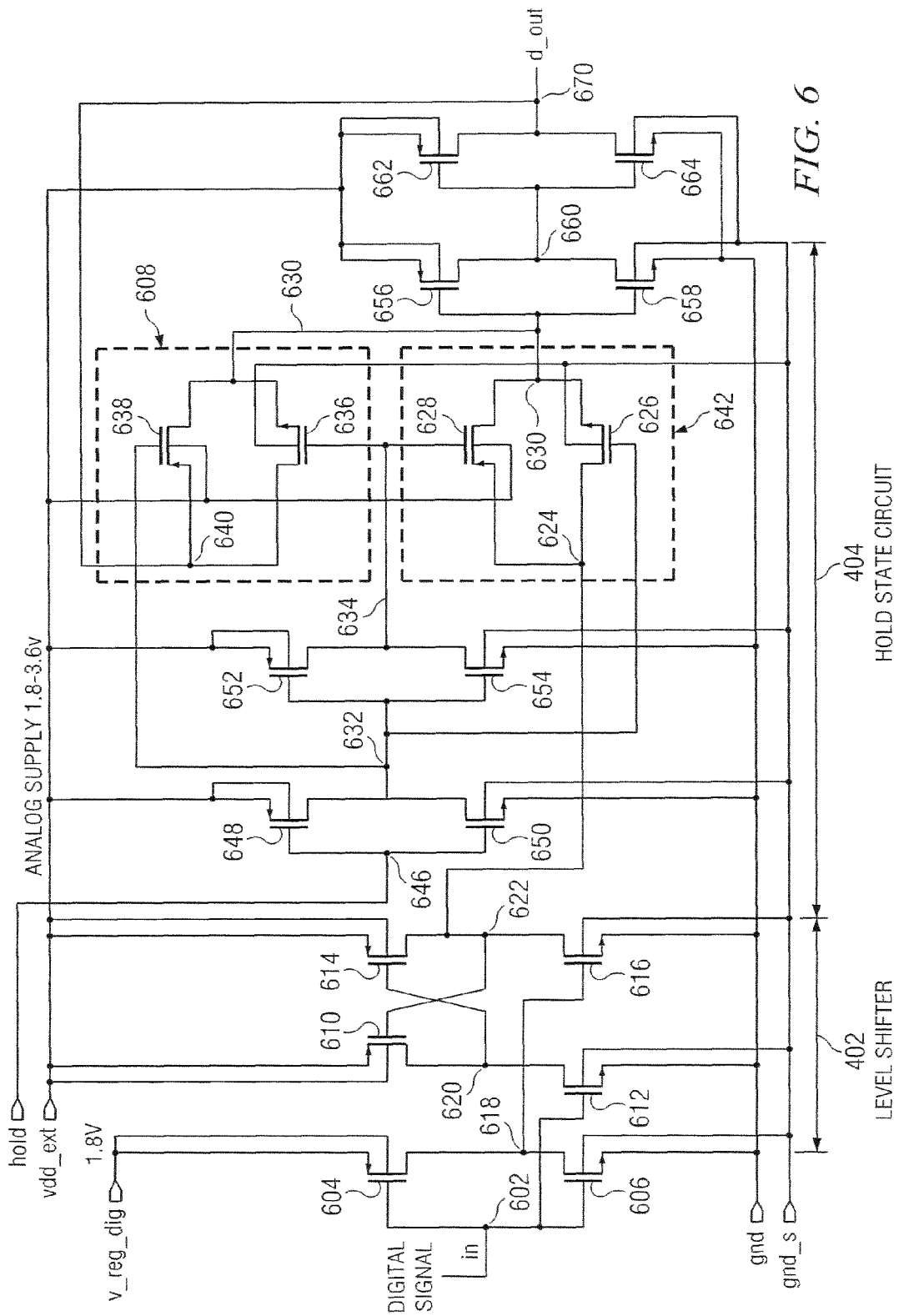
FIG. 6 is a schematic diagram of the hold logic of the input/output cell.

Referring now to FIG. 6, there is provided a schematic diagram of the hold logic 404 illustrated in FIG. 5. The DIN signal is provided at node 602, and the DOUT signal is provided at node 670. The level shifter 402 consists of transistors 606-616. The gates of transistors 606 and 604 are connected to node 602. The source/drain path of transistor 604 is connected between the regulated voltage VREG and node 618. Transistor 606 has its source/drain path connected between node 618 and ground. The gate of transistor 612 is connected to node 602. The drain/source path of transistor 612 is connected between node 620 and ground. Transistor 610 has its source/drain path connected between VDD and node 620. The gate of transistor 614 is connected to node 620. The source/drain path of transistor 614 is connected between VDD and node 622. The gate of transistor 610 is also connected to node 622. Transistor 616 has its gate connected to node 618 and its source/drain path connected between node 622 and ground. The output of the level shifter 402 is taken from node 622 and provided to an input node 622 of the hold logic 404. Switch 642 consists of transistors 626 and 628. Transistor 626 has its source/drain path connected between node 622 and node 630. The gate of transistor 626 is connected to node 632. The gate of transistor 628 is connected to node 634. Switch 608 consists of transistors 636 and 638. Transistor 636 has its gate connected to node 634. The source/drain path of transistor 636 is connected between node 640 and node 630. The source/drain path of transistor 638 is also connected between nodes 640 and 630. The gate of transistor 638 is connected to node 632. The hold enable signal is applied to node 646 connected to the gates of transistors 648 and 650. The source/drain path of transistor 648 is connected between VDD and node 632. The source/drain path of transistor 650 is connected between node 632 and ground. Transistor 652 has its gate connected to node 632 as does transistor 654. Transistor 652 has its source/drain path connected between VDD and node 634. Transistor 654 has its source/drain path connected between node 634 and ground. Inverter 504 consists of transistors 656 and 658. The gates of transistors 656 and 658 are connected to node 630. The source/drain path of transistor 656 is connected between VDD and node 660. Transistor 658 has its source/drain path connected between node 660 and ground. The gates of transistors 662 and 664 are connected to node 660. Transistor 662 has its source/drain path connected between VDD and node 670. Transistor 664 has its source/drain path connected between input pin (v_reg_dig) and ground. The feedback loop is connected between node 670 connected to the drain of transistor 662, and the source of transistor 664 and the drains of transistors 638 and 636, respectively.

In operation of the circuit of FIG. 6, the level shifter receives a digital input on node 602 which will either be a logic "1" or a logic "0." This logic voltage will see a rail-to-rail variation of zero to approximately 1.7 V, the regulated power domain voltage. When the logic "1" occurs, this turns on transistor 606 and also turns on transistor 612. Turning on transistor 606 and the regulated power domain also results in node 618 going low and turning off transistor 616. Since transistor 612 has been turned on, this will pull node 620 low, turning on transistor 614 and raising the node 622 high. Node 622 will turn off transistor 610 such that the logic "1" is now latched onto node 624. Similarly, for a logic "0" input on node 602, transistor 612 is turned off and transistor 604 is turned on putting node 618 high and transistor 616 is turned on, pulling node 624 low and turning on transistor 610 to pull up node 620 and turn off transistor 614, thus putting a logic "0" onto node 624. The hold signal is received on node 646 is a global hold signal that will be high when asserted. This will turn on transistor 650 and turn off transistor 648 and raise node 632 low. When node 632 is pulled low, this turns on transistor 654 and turns off transistor 652 pulling node 634 high. The first switch, switch 642, is represented by the transistors 626 and 628, one side thereof connected to node 624 and the other side connected to node 630. When node 632 is pulled low, this turns off transistors 626 and 628. Switch 608 is represented with transistors 636 and 638 and node 632 going low will turn on transistor 638 and transistor 636 will be turned off by transistor 654 being turned off and transistor 652 being turned on pulling node 634 high, node 634 also controlling transistor 628. Thus, node 640, which is connected to node 630 by transistors 636 and 638 will provide a feedback from the output 670. The inverter 504 is represented with the transistors 656 and 658 and the inverter 506 is represented by the transistors 662 and 664.

Referring now to FIGS. 7a-7c, there is illustrated the operation of the input/output cell 210 responsive to various voltage inputs when the microcontroller unit 100 is in both the comatose and powered modes of operation. FIG. 7a illustrates a powered mode of operation wherein a 1.8 V digital signal (digital "1") is provided to the level shifter 402. The level shifter 402 shifts the 1.8 V signal to the 3.6 V level (digital "1"), and the hold logic merely passes through the 3.6 V signal since the enable input to the hold logic is receiving a 0V signal (digital "0"). Referring now to FIG. 7b, the input/output cell 210 operates in a similar manner when a 0V (digital "0") signal is applied to the level shifter 402. The level shifter 402 provides an output 0V (digital "0") signal, and the hold logic 404 passes through the 0 V signal responsive to the hold input receiving a 0V (digital "0") value.

Referring now to FIG. 7c, when the hold input of the hold logic 404 receives a 1.8 V control value (digital "1"), the input to the level shifter 402 will be 0 V from the associated digital circuitry since this circuitry will be in the comatose mode and the output of the level shifter 402 will also be 0 V. The output of hold logic 404 will either be 3.6 V or 0 V depending upon the voltage level provided from the level shifter 402 when the hold enable input goes high on the hold logic 404. In this manner, the output of the hold logic 404 may be maintained at a constant state during the comatose mode.

Referring now to FIG. 8, there is more fully illustrated the separation between the operation of a digital portion 802 of the microcontroller unit 100 and an analog portion 804 of the microcontroller unit 100. The digital portion 802 and the analog portion 804 are separated along a line 806. This line 806 is used merely for illustrative purposes as the actual microcontroller unit 100 would include all of the digital and analog components on a single chip interconnected as necessary to achieve operation. Devices such as the program memory 116, the processing core 102, the clock circuit 108 and the power on reset 114 all reside upon the digital portion 802 of the microcontroller unit 100 as they are completely digital components and will be operated at the regulated power level. Components residing on the analog portion of the chip include the analog multiplexer 148 and the analog comparator 142 which will be operated at the unregulated power level. These components are wholly analog. Some components upon the microcontroller unit 100 lie both upon the digital portion 802 and the analog portion 804 as they each contain both digital and analog circuitry. Examples of these types of components include the digital input/output 808, the analog-to-digital converter 146 and the digital-to-analog converter 810. The digital components are provided with a regulated voltage from the voltage regulator 204. The regulator 204 provides the regulated voltage to the digital components and may be reconfigured to provide a regulated 0V signal during the comatose mode responsive to a STARTCOMA control signal from the processing core 102. The power pin VDD 150 provides unregulated power to the voltage regulator 204, and the regulator 204 provides the regulated voltage to the digital components. The VDD pin 150 also supplies power to each of the analog components, both of those being solely analog and those being both analog and digital within the microcontroller unit 100.

In general, the major processing components of MCU 100 will be the switching portions of the digital circuitry, these being clocked operations. To achieve the density of the circuitry, manufacturing processes are utilized which typically require lower operating voltage levels. At these lower operating voltages, a higher current is utilized. The regulator allows the lower voltage to be applied to the digital circuitry to maintain a digital circuitry within its proper operating voltage range, but a higher VDD on the input can result in excessive power being dissipated in the voltage regulator circuit. This is the reason that the comatose mode desires that the regulator be turned off. Merely terminating the clocking operation does not inhibit leakage current from continuing to be dissipated. Therefore, reducing the regulated voltage to 0 V reduces power loss due to leakage current. Of course, the external circuitry, the chips that interface with the MCU 100, may operate at a different voltage level, thus, the requirement for the left level shifted voltages is needed. In order to maintain the output states of the various pins at a predetermined level requires that configuration information be retained wherein a digital I/O pad has the capability of being configured as a digital output, a digital input or an analog input/output, must be maintained. This configuration information is determined by a digital control signal received from the processing core and it is desirable in accordance with the present disclosure to maintain this control signal to the I/O circuitry. Thus, the latch circuitry of the present disclosure allows any digitally controlled portion in the high powered unregulated power domain to be maintained in its last known state such that the digital circuitry can be completely powered down. Upon power up, the digital circuitry will return to a predetermined power up configuration and known states. For example, if an I/O pad on the chip were configured as a digital input, it would receive a digital control signal from the processing core 102 for such configuration. If this control signal were removed during the comatose mode, the input/output cell could possibly revert to an analog configuration which may present a little impedance to circuitry that expects a high impedance. This would be potentially dangerous to external circuitry. However, it may be that a digital output is latched as a digital "1" and, upon power up, the initial state in power up may be a logic "0" and the state would thus change. In that situation, the changing of the state would not be that disadvantageous.

Referring now to FIG. 9, there is more fully illustrated a digital component including both analog and digital portions as described previously with respect to FIG. 8. In this case, the digital/analog component comprises the analog-to-digital converter 146. The analog portion 902 includes circuitry necessary to receive and sample the analog input 904 provided to the analog-to-digital converter 146. Likewise, the digital portion 906 includes the switching circuitry necessary to provide the analog-to-digital conversion and output a digital output signal on bus 908. The digital portion 906 is provided the voltage $V_{REG}$ from the voltage regulator 204 on input pin 910. Likewise, the analog portion 902 of the analog-to-digital converter 146 is provided system power VDD on input pin 912. Located between the analog circuitry 902 and the digital circuitry 906 of the analog-to-digital converter 146 is the level shifter circuitry 914. This enables the operating voltage level necessary for operating in the digital domain to be shifted from the operating voltage necessary for operation in the analog domain directly at the digital analog interface of the microcontroller unit 100. The level shifter 914 may be similar to the input/output cell 210 discussed hereinabove.

Figure 10:
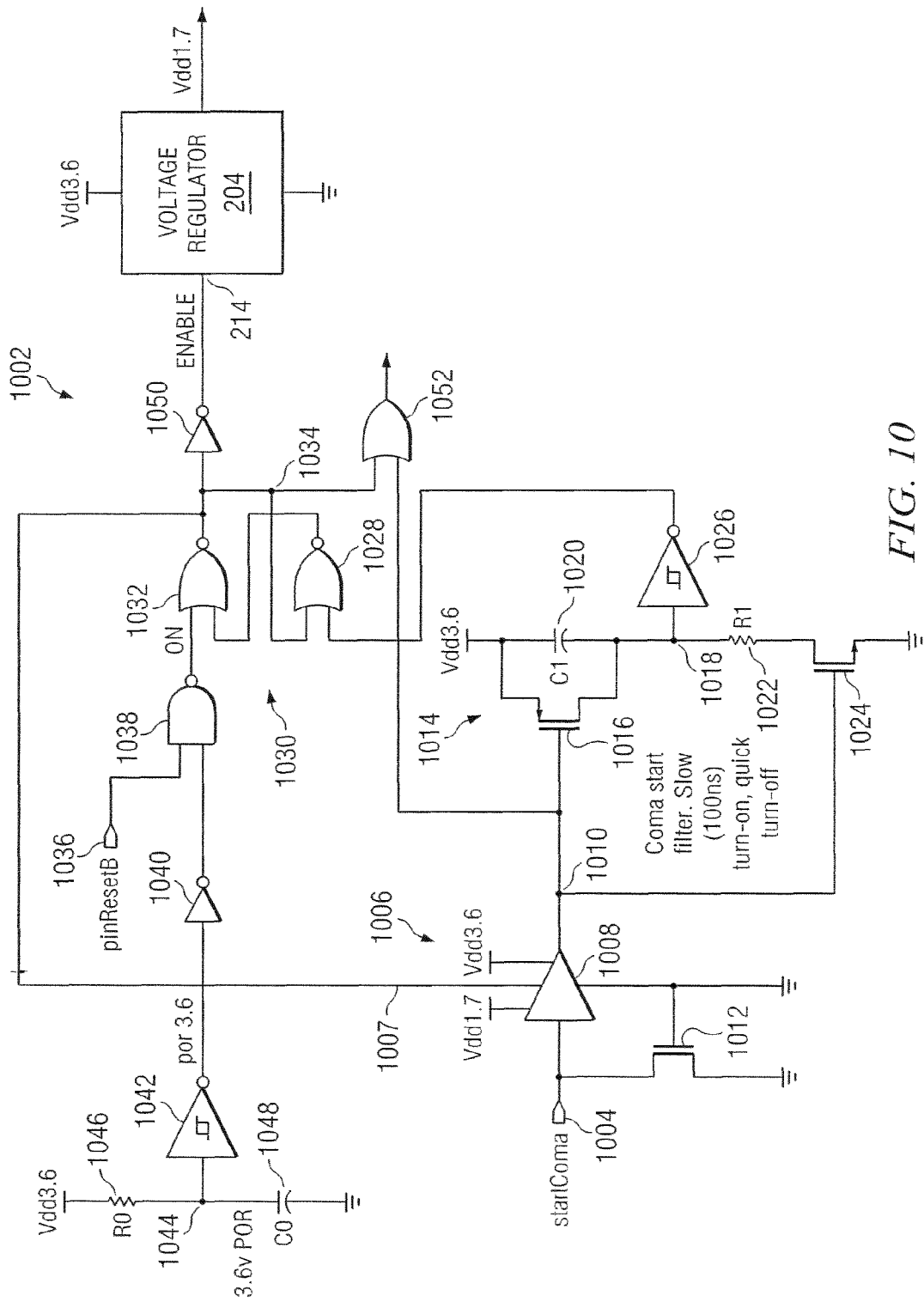
FIG. 10 illustrates the comatose mode logic.

Referring now to FIG. 10, there is illustrated the comatose mode logic 220. The comatose mode logic 220 is responsible for initiating the comatose mode responsive to a STARTCOMA signal received from the processor 102 at input 1004. Receipt of the STARTCOMA signal at the input 1004 will ultimately place the voltage regulator 204 into the comatose mode. Once the STARTCOMA signal is received at input 1004, the signal is provided to a level shifter circuit 1006. The level shifter circuit 1006 operates using a regulated voltage supply from the voltage regulator 204. The level shifter 1006 is configured such that it outputs a digital zero voltage level when no regulated voltage is supplied to it from the voltage regulator 204 responsive to a control input on line 1007. The level shifter 1006 consists of an operational amplifier 1008 having its input connected to the STARTCOMA input 1004 and its output connected to node 1010. The operational amplifier 1008 is connected to both system power VDD and regulated voltage $V_{REG}$. The operational amplifier also receives a control signal on line 1007 to drive the output of the level shifter 1006 to zero. A transistor 1012 has its source/drain path connected between the input of the operational amplifier 1008 and ground. The gate of the transistor 1012 is also connected to ground.

A start filter 1014 is connected to the output of the operational amplifier 1008 of the level shifter 1006 at node 1010. The start filter 1014 is needed on the STARTCOMA signal to filter out noise from turning on/off the voltage regulator 204 and also provides a delay to enable the latching of digital outputs before the regulator 204 enters comatose mode. In particular, the filter 1014 prevents noise from the waking up of the voltage regulator 204 placing the voltage regulator back into comatose mode. The start filter 1014 consists of a first p-channel transistor 1016 having its source/drain path connected between system power VDD and node 1018. The gate of transistor 1016 is connected to node 1010. A capacitor 1020 is connected between the source and drain of transistor 1016. A resistor 1022 is connected between node 1018 and the source of transistor 1024. The transistor 1024 has its source/drain path connected between resistor 1022 and ground. The gate of transistor 1024 is connected to node 1010. The input of a Schmidt trigger inverter 1026 is connected to node 1018 and the output of the Schmidt trigger inverter 1026 is provided to a first input of a nor gate 1028, this providing a delay.

When the STARTCOMA signal applied to input 1004 is low, the level shifter 1006 and start filter 1014 do not affect the operation of the comatose logic circuit since the output of the Schmidt trigger inverter 1026 will be low, providing an off signal to the cross coupled latch 1030 consisting of NOR gate 1028 and NOR gate 1032. However, once the signal from the Schmidt trigger inverter 1026 goes high responsive to a high STARTCOMA signal applied to input 1004, the process to place the voltage regulator 204 in the comatose mode is initiated by the signal from the Schmidt trigger inverter 1026.

The second input of the NOR gate 1028 within the cross-coupled latch 1030 is connected to node 1034. The output of NOR gate 1028 is connected to a first input of the NOR gate 1032. The second input of nor gate 1032 receives a signal to activate the voltage regulator 204 when the regulator is in the comatose mode responsive to a wake-up signal applied to the pin reset B input 1036 from the processing core 102. The output of the NOR gate 1032 within the voltage regulator enable latch 1030 (cross-coupled latch) is applied to the input of inverter 1050. The output of inverter 1050 is provided to the enable input 214 of the voltage regulator 204. The pin reset B input 1036 is applied to a first input of NAND gate 1038. The second input of NAND gate 1038 is connected to an output of inverter 1040. The input of the inverter 1040 is connected to the output of a Schmidt trigger inverter 1042. The input of the Schmidt trigger inverter 1042 is connected to node 1044. A resistor 1046 is connected between VDD and node 1044. A capacitor 1048 is connected between node 1044 and ground. The reset B input 1036 is normally high. When the reset B pin 1036 is driven low by the processing core 102, the output of the NAND gate 1038 will cause the voltage regulator 204 to be turned on and drive the output of level shifter 1006 to zero. The power on reset 114 applied to the voltage regulator 204 is needed to reset the digital system when the regulator is turned on responsive to the reset input going high.

Generation of the hold signal to each of the hold logic circuits 404 within the input/output cells 210 is generated in the following manner. An OR gate 1052 has a first input connected to node 1010 at the output of the level shifter 1006. The second input of the OR gate 1052 is connected to node 1034 at the output of the NOR gate 1032 of the cross-coupled latch 1030. The output of the OR gate 1052 comprises the global hold signal used to latch the hold logic of the input/output cells 210 when the STARTCOMA signal goes high.

To summarize the operation of the comatose mode logic 1002, the STARTCOMA signal on input 1004 is pulled high, this will be level shifted to a higher level at node 1010, thus asserting the global hold signal on the output of the OR gate 1052. At the same time, it will turn on transistor 1024 and, after a delay associated with the Schmidt trigger 1026 and the resistor 1022, the input to NOR gate 1028 will be pulled high, thus forcing the output low. This will result in both inputs of the OR gate 1032 being low to force the output of OR gate 1032 high and latch a logic "1" on the output thereof to result in the enable input to a regulator 204 on input 214 going low and disabling the regulator and pulling the voltage to 0 V. This will be latched and the latch circuit comprised of the NOR gates 1032 and 1028. Once the output of NOR gate 1032 goes high, this will cause the output of the level shifter 1006 to be latched to a predetermined state, such that there will be no noise through the filter 1014. This will be described hereinbelow. Additionally, the state of the node 1010 is not important, since the latched output of NOR gate 1032 is comprised of the second input to the OR gate 1052, such that this controls the assertion of the global hold signal.

Figure 11:
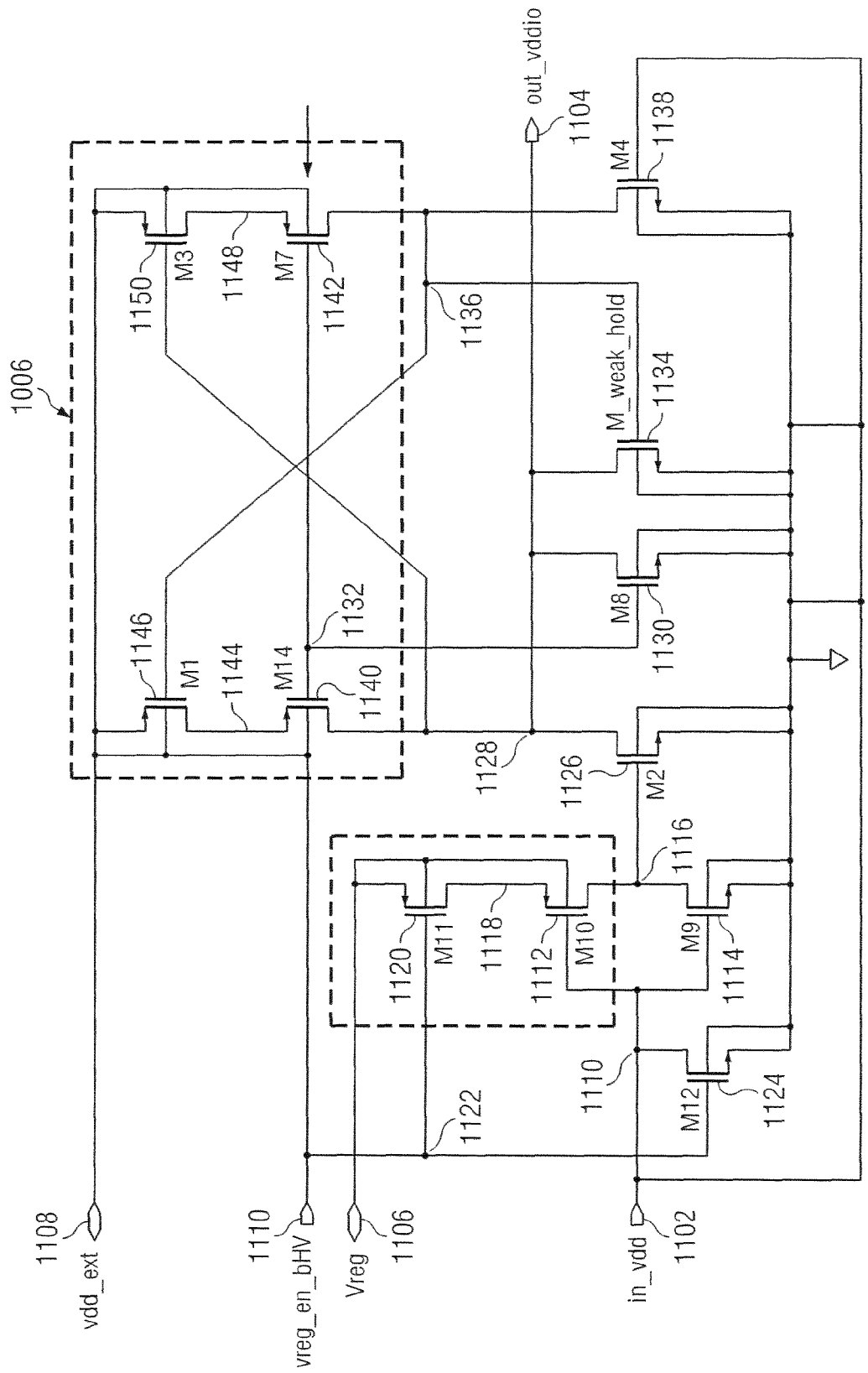
FIG. 11 is a schematic diagram of the level shifter in the comatose mode logic.

Referring now to FIG. 11, there is illustrated a schematic diagram of the level shifter 1006. The level shifter 1006 includes an input 1102 for the STARTCOMA signal applied at input 1004 of FIG. 70. The output of the level shifter 1006 is applied at node 1104. The regulated voltage from the voltage regulator 204 is applied at input 1106 and the system voltage VDD is applied at input 1108. An input from the voltage regulator enable latch 1030 is applied at input 1110. This input enables the output 1104 of the level shifter 1006 to be driven to the steady low (digital "0") value that is required for the level shifter 1006 when the comatose mode is initiated. The STARTCOMA signal is applied to node 1110. Transistors 1112 and 1114 have their gates connected to node 1110. Transistor 1114 has its source/drain path connected between node 1116 and ground. Transistor 1112 has its source/drain path connected between node 1118 and node 1116. Transistor 1120 has its source/drain path connected between VREG and node 1118. The gate of transistor 1120 is connected to node 1122 which is connected to receive the enable signal from the voltage regulator enable latch 1030 via input 1110. Transistor 1124 has its gate connected to node 1122. The source/drain path of transistor 1124 is connected between node 1110 and ground. Transistor 1126 has its gate connected to node 1116. The drain/source path of transistor 1126 is connected between node 1128 which is connected to output node 1104 and ground. Transistor 1130 is connected between node 1128 and ground. The gate of transistor 1130 is connected to node 1132. Transistor 1134 has its source/drain path connected between node 1128 and ground. The gate of transistor 1134 is connected to node 1136. Transistor 1138 has its source/drain path connected between node 1136 and ground. The gate of transistor 1138 is connected to node 1110. Transistors 1140 and 1142 have their gates connected to node 1132 which is connected to the voltage regulation enable input 1110. The source/drain path of transistor 1140 is connected between node 1144 and node 1128. Transistor 1146 has its source/drain path connected between VDD and node 1144. The gate of transistor 1146 is connected to node 1136. Transistor 1142 has its source/drain path connected between node 1148 and node 1136. Transistor 1150 has its source/drain path connected between VDD and node 1148. The gate of transistor 1150 is connected to node 1128.

When the STARTCOMA signal is initially applied at input node 1102 the corresponding level shifted signal is output at node 1104. This signal passes through the start filter 7014 to create the digital high signal from the Schmidt trigger inverter 726 that causes the enable signal applied to the voltage regulator 204 to go low. This creates the output from the voltage regulator enable latch 1030 that is provided back to the level shifter 1006 via line 1007. This causes the output 1104 to be pulled to a solid low (digital "0") causing the output of the level shifter 1006 to remain in the steady low state throughout the comatose mode.

Figure 12A:
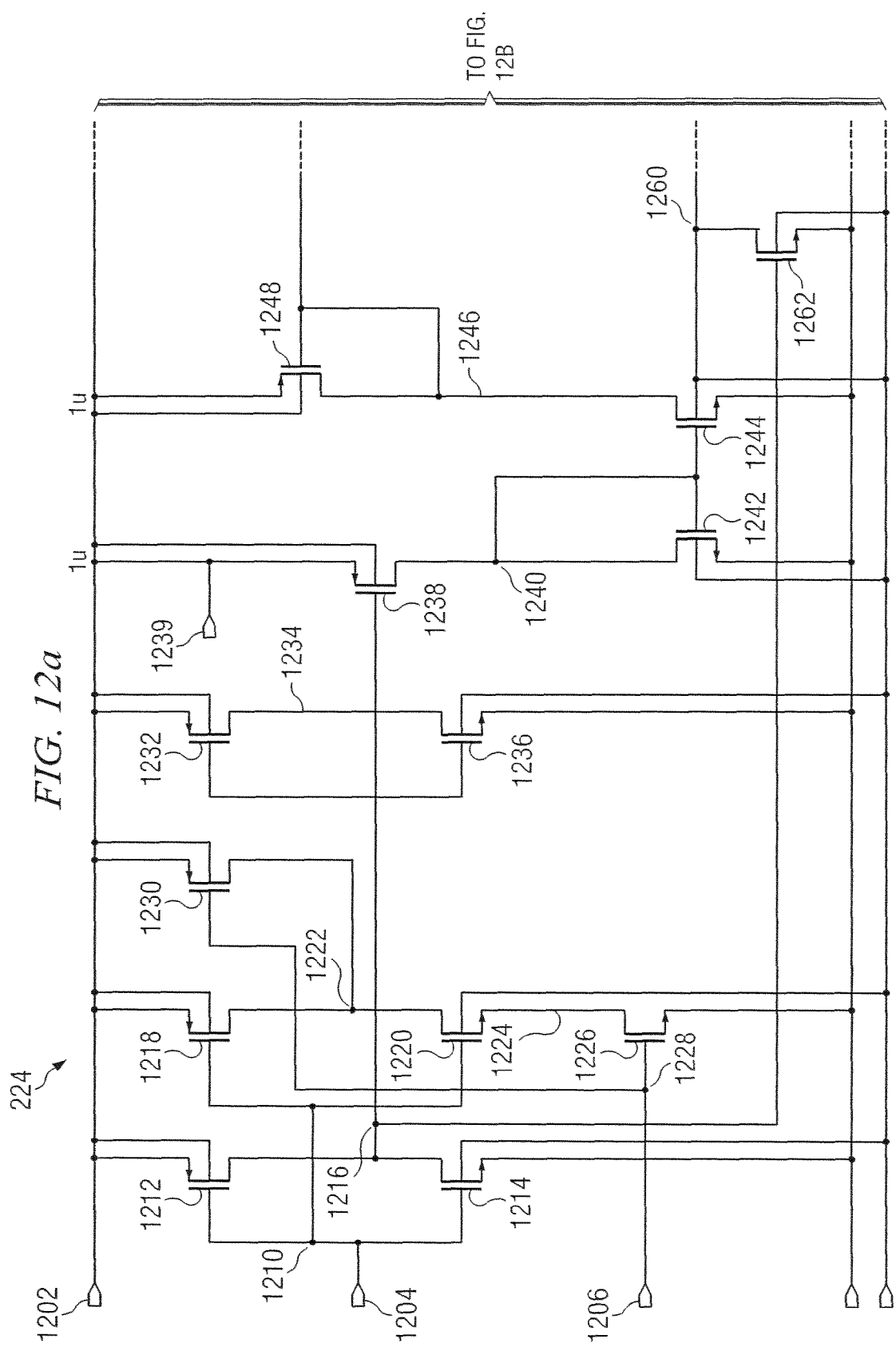

Referring now to FIGS. 12a and 12b, there is more fully illustrated the voltage regulator 204. The non-regulated system voltage VDD is input to the voltage regulator 204 at input 1202. The voltage regulator enable signal is applied to the enable input 1204. A bypass signal is provided to the voltage regulator 204 at input 1206. The regulated voltage signal is applied from output 1208. The enable signal is applied to input 1204 to node 1210 of the voltage regulator 204. The gate of transistor 1212 and the gate of transistor 1214 are each connected to node 1210. Transistor 1212 has its source/drain path connected between VDD and node 1216. Transistor 1214 has its source/drain path connected between node 1116 and ground. Transistors 1218 and 1220 additionally have their gates connected to node 1210. Transistor 1218 has its source/drain path connected between VDD and node 1222. Transistor 1220 has its source/drain path connected between node 1222 and node 1224. Transistor 1226 has its source/drain path connected between node 1224 and ground. The gate of transistor 1226 is connected to the bypass input 1206 at node 1228. Transistor 1230 also has its gate connected to node 1228 and has its source/drain path connected between VDD and node 1222. Transistor 1232 has its source/drain path connected between VDD and node 1234. Transistor 1236 has its source/drain path connected between node 1234 and ground. The gates of transistors 1232 and 1236 are interconnected with each other. Transistor 1238 has its source/drain path connected between control input 1ptci 1239 and node 1240. The gate of transistor 1238 is connected to node 1216. Transistor 1242 has its source/drain path connected between node 1240 and ground. The gate of transistor 1242 is connected to node 1240. Transistor 1244 has its gate connected to node 1240. The drain/source path of transistor 1244 is connected between node 1246 and ground. Transistor 1248 has its source/drain path connected between VDD and node 1246. The gate of transistor 1248 is connected to node 1246. Transistor 1250 has its source/drain path connected between VDD and node 1252. The gate of transistor 1250 is connected to node 1246. Transistor 1254 has its source/drain path connected between node 1266 and node 1256. The gate of transistor 1254 is connected to node 1268. Transistor 1258 has its source/drain path connected between node 1256 and ground. The gate of transistor 1258 is connected to node 1260. Transistor 1262 has its source/drain path connected between node 1260 and ground. The gate of transistor 1262 is connected to node 1216.

Transistor 1264 has its source/drain path connected between node 1266 and node 1256. The gate of transistor 1264 is connected to the reference voltage $V_{REF}$ at input 1268. Transistor 1270 has its source/drain path connected between nodes 1272 and nodes 1266. Transistor 1274 has its drain/source path connected between node 1276 and node 1272. The gate of transistor 1274 is connected to node 1246. Transistor 1278 has it source/drain path connected between VDD and node 1276. The gate of transistor 1278 is connected to node 1272. The gate of transistor 1280 is connected to node 1272. The source/drain path of transistor 1280 is connected between VDD and node 1281. Transistor 1282 has its gate connected to node 1246. The source/drain path of transistor 1282 is connected between node 1281 and node 1283. Transistor 1284 has its gate connected to node 1252. The drain/source path of transistor 1284 is connected between node 1283 and node 1285. The source/drain path of transistor 1286 is connected between node 1285 and node 1256. The gate of transistor 1286 is connected to receive signal v_fb at 1201. Transistor 1287 is connected to node 1288. Node 1288 is connected to receive the bypass enable signal. The source/drain path of transistor 1287 is connected between VDD and node 1283. A capacitor 1289 is connected between node 1283 and ground. Transistor 1290 has its source/drain path connected between VDD and node 1291. Transistor 1292 has its source/drain path connected between node 1291 and ground. The gates of transistors 1290 and 1292 are connected to each other. Transistor 1294 is connected between VDD and node 1295. The gate of transistor 1294 is connected to node 1291. Transistor 1296 has its source/drain path connected between node 1295 and 1297. Resistor 1298 is connected between node 1297 and node 1299. Node 1299 is also connected to the $V_{SEN}SE$ output 1300. Resistor 1301 is connected between node 1299 and node 1303. Transistor 1305 is connected between node 1303 and ground.

When the enable signal is high, this will turn on transistor 1214 and pull the gate of transistor 1238 low, turning on transistor 1238. This will provide current flow to the bias transistor 1242. This is a diode-connected transistor which will have the current there through mirrored over to the transistors 1244 and 1248 and the current source at the common node 1256 comprised of the transistor 1258. This basically provides the bias circuitry to the regulator core. When bypass is low, this will result in the gate of transistor 1296 being controlled by the voltage on node 1283. This is due to the fact that the transistor 1287 is turned off. Thus, this will result in a regulated output voltage. When the bypass mode is selected, the bypass signal and enable signal are raised to digital "1." This results in transistor 1226 turning off and transistor 1230 turning off, thus pulling node 1222 low, this being the gbypass_enableb signal going low. This pulls the gate of transistor 1287 low, turning on transistor 1287 and pulling the gate of transistor 1296 high and overriding the regulated voltage on node 1283. This will therefore force the voltage on node 1202 to be impressed upon node 1208. Additionally, transistor 1305 is turned off such that current will not flow through the resistors 1297 and 1301.

Figure 13:
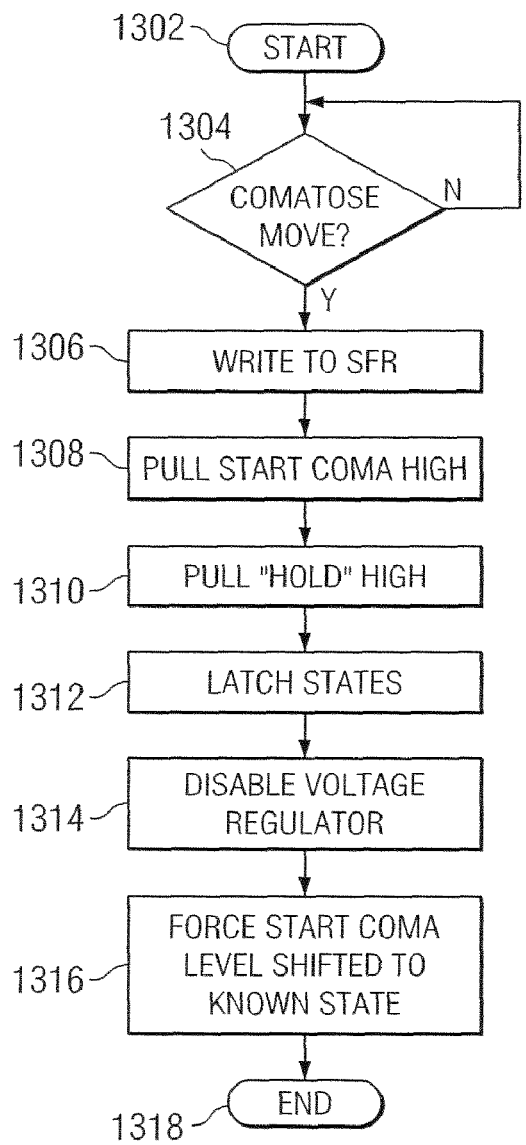
FIG. 13 is a flow diagram illustrating the process for entering comatose mode.

Referring now to FIG. 13, there is illustrated a flow diagram describing the operation of the microcontroller unit 100 when entering the comatose mode. The process is initiated at step 1302 and inquiry step 1304 monitors for an indication of initiation of the comatose mode by the processor 102. When the comatose mode is initiated at inquiry step 1304, the processing core 102 writes a bit to the SFR register associated with the comatose operation at step 1306 to initiate the comatose mode. Responsive to the bit indicating the start of the comatose mode within the SFR register, the STARTCOMA pin within the comatose mode logic is pulled high at step 1308. Additionally, at step 1310, the hold signal for latching the outputs of the digital circuits is pulled high. Responsive to the high hold signal, the outputs of the digital circuits are latched at step 1312 to their most recent states. The voltage regulator is then disabled at step 1314 after a small delay to allow the global hold signal to be asserted. Additionally, the level shifted STARTCOMA signal from the level shifter 1006 is forced to a known zero state at step 1316. The microcontroller unit 100 will then be within the comatose mode, and the process ends at step 1318.

Figure 14:
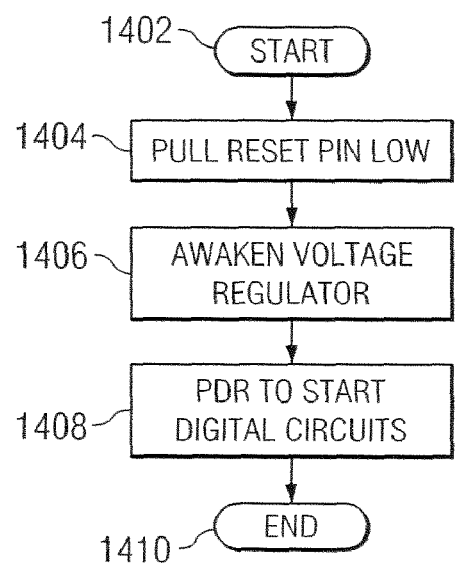
FIG. 14 is a flow diagram illustrating the process for powering up from comatose mode.

Referring now to FIG. 14, there is illustrated the process for coming out of the comatose mode state. The process is initiated at step 1402 and the reset bar pin is pulled low at step 1404. Once the reset bar pin goes low the voltage regulator 204 is awakened at step 1406 responsive to an enable signal from the voltage regulator enable latch 1030. This basically resets the latch comprised of the NOR gates to a logic "0" on the node 1034 that pulls the one input of NOR gate 1052 low and the SFR bit for the STARTCOMA signal is also initially asserted as a logic "0" by the core 102. The power on reset circuitry is used at step 1408 to initialize all of the digital circuits within the microcontroller unit 100. Once all digital circuits have been returned to the powered state, the process is completed at step 1410.

Referring now to FIG. 15, there is illustrated an alternate embodiment of the hold latch. In this embodiment, the voltage $V_{REG}$ is utilized in place of the hold signal. In the digital domain, there will be some type of driver that will drive a voltage output at the regulated voltage $V_{REG}$. For exemplary purposes, this is illustrated as a CMOS pair comprised of an n-channel transistor 1502 and a p-channel transistor 1504 connected in series between $V_{REG}$ and ground with the gates thereof connected to an input 1506. This will result in an output digital voltage or signal $D_{IN}$. This is input through a buffer 1508 which is operated at $V_{REG}$ to provide an output on a data line 1510. The data line 1510 is input to the gates of two series connected CMOS transistors, a p-channel transistor 1512 and an n-channel transistor 1514 connected in series to provide an output on an output node 1516. The transistors 1512 and 1514 are disposed between $V_{REG}$ and ground.

A latch and level shift circuit 1520 is provided for receiving the output of the transistors 1512 and 1514. An n-channel transistor 1522 is connected between a node 1524 and ground and an n-channel transistor 1526 is connected between a node 1528 and ground. The gate of transistor 1522 is connected to the node 1510, which drives the gates of transistors 1512 and 1514, and the node 1516 is connected to the gate of transistor 1526. Therefore, when a logic "0," for example, is disposed on node 1510, this will turn off transistor 1522 and node 1516 will be a logic "1" which will turn on transistor 1526 pulling node 1528 low. A p-channel latch is provided with a p-channel transistor 1530 connected between VDD external (unregulated VDD) and node 1524 and a p-channel transistor 1532 connected between VDDEXT and node 1528. The gates of transistors 1530 and 1532 are cross-coupled such that the gate of transistor 1530 is connected to node 1528 and the gate of transistor 1532 is connected to node 1524. Thus, for the logic state described hereinabove, on the node 1510, the transistor 1530 will have the gate thereof pulled low and will turn on the pulled node 1524 high, node 1524 comprising one output. Transistor 1532 will have a gate thereof pulled high, thus turning it off and allowing transistor 1526 to pull node 1528 low, node 1528 comprising the other output, either of the outputs 1524 and 1528 selectable as the output of the latch.

There is provided a secondary latch circuit for operating the power-down mode when VREG is pulled to 0 V. This is comprised of an n-channel transistor 1540 having the source/drain path thereof connected between node 1524 and ground and the gate thereof connected to node 1528. An n-channel transistor 1542 has the source/drain path thereof connected between node 1528 and ground and the gate thereof connected to node 1524. The transistors 1540 and 1542 relative to the transistors 1522 and 1526, respectively, are "weak" transistors. This means that they have a substantially higher transconductance associated therewith. This is facilitated by fabricating the transistors 1540 and 1542 to be approximately half the size of transistors 1522 and 1526 and by multiplying by combining the number of transistors 1522 and 1526 such that transistors 1522 and 1526 is comprised of approximately six transistors. Thus, each of the transistors in the parallel configuration for transistor 1522 and transistor 1526 comprise the six transistors that are twice the size, such that the size difference is 12.times.. Thus, if, for some reason, transistor 1522 were turned on when either of transistors 1540 or 1542 were turned on, they would overpower those transistors and the effect of transistors 1540 and 1542 would have little effect.

In operation, when the power down mode is asserted, $V_{REG}$ will be pulled low by disabling the regulator. When this occurs, $V_{REG}$ is pulled to ground. When this occurs, $V_{REG}$ associated with the digital side, both transistors 1504 and 1502, will pull node 1510 low and there will be a logic "0" disposed thereon. At the same time, $V_{REG}$ on the source/drain path of 1512 will result in node 1516 being pulled low. Thus, the gates of transistors 1522 and 1526 will be pulled low, thus turning those transistors off. However, if there was, for example, a logic "0" on node 1524 and a logic "1" on node 1528, the logic "0" on node 1524 would turn transistor 1542 off, thus allowing the logic "1" to remain on node 1528. The transistor 1540 would maintain node 1524 low. Similarly, when transistor 1526 turns off, the logic "1" will be maintained on node 1528, as transistor 1542 is already in an off condition. Thus, the two weak transistors forming the secondary latch will maintain the latch state as a result of these two transistors 1522 and 1526 being turned off. Thus, it can be seen that no hold signal is required; rather, all that is required is for the $V_{REG}$ to be pulled low to reduce full force the transistors 1522 and 1526 to be turned off and retain the state of the latches. When $V_{REG}$ is again pulled high, whatever data is on the input 1506 from the digital side, i.e., the side associated with the regulated voltage, will be asserted on nodes 1510 and 1516 and the latch will then have potentially new value. However, the important aspect is that, during the power-down mode, that the last known state of the latch is maintained.

Although the preferred embodiment has been described in detail, it should be understood that various changes, substitutions and alterations can be made therein without departing from the scope of the invention as defined by the appended claims.

What is claimed is:

1. An apparatus, comprising:
at least one digital device configurable to be powered by a regulated voltage and to enter a powered down state from a powered state responsive to the regulated voltage decreasing to a powered down level, the at least one digital device having at least one output for providing at least one digital output signal when in the powered state; and
an input/output cell connected to receive the at least one digital output signal, the input/output cell maintaining a last state of the at least one digital output signal responsive to the at least one digital device entering the powered down state.

2. The apparatus of claim 1, wherein the input/output cell further comprises hold logic for maintaining the last state of the at least one digital output signal in the last state responsive to a hold signal.

3. The apparatus of claim 2, further comprising a voltage regulator including a first input for receiving an input voltage, a second input for receiving the power down signal, and an output for providing a regulated voltage having a first voltage level during normal operation and having a second voltage level in response to the power down signal.

4. The apparatus of claim 1, wherein the input/output cell further comprises a level shifter for shifting the level of the at least one digital output signal to a desired level.

5. The apparatus of claim 4, further comprising a processor coupled to the voltage regulator and configured to generate the power down signal.

6. The apparatus of claim 1, wherein the input/output cell further comprises:
a pair of inverter circuits connected in series;
a first switch for connecting and disconnecting the at least one digital output signal to and from the pair of inverter circuits responsive to a hold signal;
a feedback loop connected between an output of the pair of inverter circuits and an input of the pair of inverter circuits; and
a second switch for opening and closing the feedback loop between the output and the input of the pair of inverter circuits responsive to the hold signal.

7. The apparatus of claim 6, wherein the first switch is closed and the second switch is open responsive to the hold signal in a first state and the first switch is open and the second switch is closed responsive to the hold signal in a second state.

8. The apparatus of claim 1, further including at least one analog circuit connected to the input/output cell for receiving the digital output signal.

9. The apparatus of claim 1, further comprising a controller including an input for receiving the power down signal and an output for providing a hold signal to the input/output cell in response to the power down signal, the hold signal to control the input/output cell to maintain the last state of the at least one digital output signal.

10. A microcontroller unit, comprising:
   at least one digital device powered by a regulated voltage and entering a powered down state from a powered state responsive to the regulated voltage going to a powered down level in the power down state, the at least one digital device providing at least one digital output signal; and
   an input/output cell connected to receive the at least one digital output signal, the input/output cell maintaining a last state of the at least one digital output signal responsive to the at least one digital device entering the powered down state; and
   at least one analog circuit powered by the regulated voltage and connected to the input/output cell for receiving the digital output signal from the at least one digital device.

11. The microcontroller unit of claim 10, wherein the input/output cell further comprises hold logic for maintaining the last state of the at least one digital output signal in the last state responsive to a hold signal.

12. The microcontroller unit of claim 10, wherein the input/output cell further comprises:
   a pair of inverter circuits connected in series;
   a first switch for connecting and disconnecting the digital output signal to the pair of inverter circuits responsive to a hold signal;
   a feedback loop connected between an output of the pair of inverter circuits and an input of the pair of inverter circuits; and
   a second switch for opening and closing the feedback loop between the output and the input of the pair of inverter circuits responsive to the hold signal.

13. The microcontroller unit of claim 12, wherein the first switch is closed and the second switch is open responsive to the hold signal in a first state and the first switch is open and the second switch is closed responsive to the hold signal in a second state.

14. An input/output cell, comprising:
   an input pin;
   an output pin;
   a pair of inverter circuits connected in series;
   a first switch between the input pin and the pair of inverter circuits for connecting and disconnecting a digital output signal to the pair of inverter circuits responsive to an associated digital device entering a powered down state;
   a feedback loop connected between an output of the pair of inverter circuits and an input of the pair of inverter circuits;
   a second switch for opening and closing the feedback loop between the output and the input of the pair of inverter circuits responsive to the associated digital device entering the powered down state; and
   wherein the pair of inverter circuits and the feedback loop maintain a last state of a digital signal on the output pin responsive to the associated digital device entering the powered down state.

15. The input/output cell of claim 14, wherein the first switch is closed and the second switch is open in a first state and the first switch is open and the second switch is closed in a second state.

16. The input/output cell of claim 14, further comprising:
   a first control input coupled to the first switch for providing a first control signal adapted to control a state of the first switch; and
   a second control input coupled to the second switch for providing a second control signal adapted to control a state of the second switch; and
   wherein the first and second control signals control the states of the first and second switch in response to the associated digital device entering the powered down state.

17. The input/output cell of claim 14, wherein the pair of inverter circuits comprises:
   a first inverter including an input coupled to the input pin and including an output; and
   a second inverter including an input coupled to the output of the first inverter and an output coupled to the output pin.

18. A method for maintaining an output of an input/output cell, comprising the steps of:
   powering down at least one digital device powered by a regulated voltage responsive to the regulated voltage going to a powered down level in a powered down state; and
   maintaining a last state of at least one digital output signal from the at least one digital device responsive to the at least one digital device entering the powered down state.

19. The method of claim 18, wherein the step of maintaining further includes the steps of maintaining the last state of the at least one digital output signal in the last state responsive to the at least one digital device entering the powered down state.

20. The method of claim 18, wherein the step of maintaining further comprises the steps of:
   disconnecting an input of a pair of inverter circuits from the at least one digital device responsive to a hold signal generated in response to the at least one digital device entering the powered down state; and
   connecting a feedback loop connected between an output of the pair of inverter circuits and an input of the pair of inverter circuits responsive to the at least one digital device entering the powered down state.

* * * * *